US006656843B2

(12) United States Patent
Bol

(10) Patent No.: US 6,656,843 B2
(45) Date of Patent: Dec. 2, 2003

(54) SINGLE MASK TRENCH FRED WITH ENLARGED SCHOTTKY AREA

(75) Inventor: Igor Bol, Sherman Oaks, CA (US)

(73) Assignee: International Rectifier Corporation, El Segundo, CA (US)

( * ) Notice: Subject to any disclaimer, the term of this patent is extended or adjusted under 35 U.S.C. 154(b) by 20 days.

(21) Appl. No.: 10/132,551

(22) Filed: Apr. 25, 2002

(65) Prior Publication Data

US 2003/0203533 A1 Oct. 30, 2003

(51) Int. Cl.[7] ............................................. H01L 21/302
(52) U.S. Cl. ................... 438/694; 438/700; 438/723; 438/724; 438/743; 438/744
(58) Field of Search ................. 438/694, 700, 438/705, 723, 724, 743, 744

(56) References Cited

U.S. PATENT DOCUMENTS

| 5,637,898 | A | * | 6/1997 | Baliga | 257/330 |
|---|---|---|---|---|---|
| 5,726,094 | A | * | 3/1998 | Schwalke et al. | 438/561 |
| 6,229,181 | B1 | * | 5/2001 | Kravtchenko et al. | 257/355 |
| 6,235,609 | B1 | * | 5/2001 | Sengupta et al. | 438/424 |
| 6,475,875 | B1 | * | 11/2002 | Hau et al. | 438/424 |
| 6,566,708 | B1 | * | 5/2003 | Grover et al. | 257/330 |

* cited by examiner

Primary Examiner—Benjamin L. Utech
Assistant Examiner—Binh X. Tran
(74) Attorney, Agent, or Firm—Ostrolenk, Faber, Gerb & Soffen, LLP

(57) ABSTRACT

A single mask process is described for making a trench type fast recovery process. The single mask defines slots in a photoresist for locally removing strips of nitride and oxide from atop silicon and for subsequently etching trenches in the silicon. A boron implant is carried out in the bottoms of the trenches to form local P/N junctions. The oxide beneath the nitride is then fully stripped in the active area and only partly stripped in the termination area in which the trenches are wider spaced than in the active area. Aluminum is then deposited atop the active area and in the trenches, but is blocked from contact with silicon in the active area by the remaining nitride layer.

13 Claims, 2 Drawing Sheets

SINGLE MASK TRENCH FRED WITH ENLARGED SCHOTTKY AREA

Fast recovery diodes are well known. These devices frequently integrate P–N junctions and Schottky diodes in a common die. Trench Schottky diodes are also well known and are shown in U.S. Pat. No. 5,365,102 to Baliga, and in application Ser. No. 10/193,783 filed Jul. 11, 2002 entitled TRENCH SCHOTTKY in the names of Kohji Andoh and Davide Chiola, which is assigned to the assignee of the present invention.

FIELD OF THE INVENTION

This invention relates to fast recovery diodes and more specifically relates to a single mask process for the manufacture of a fast recovery diode with an increased Schottky diode area with a trench topology.

BACKGROUND OF THE INVENTION

The manufacture of fast recovery diodes with trench topology now requires the use of plural mask steps and have a relatively small Schottky diode area relative to the die or chip area.

It would be desirable to provide a fast recovery diode having an enlarged Schottky area for a lower forward voltage drop and to make the device with a reduced number of masks steps, preferably a single critical step.

BRIEF SUMMARY OF THE INVENTION

In accordance with the invention a novel fast recovery diode is made with a single critical mask step which defines a trench etch region. A locos-type process is also employed to enable the selective removal of nitride in the active area before metallization. In the resulting device, the bottoms of the trenches receive a local P type diffusion, producing small P–N junctions at each trench, while the full trench walls and the mesas between trenches receive a Schottky-forming metal.

DETAILED DESCRIPTION OF THE PREFERRED EMBODIMENTS

Figure 1:
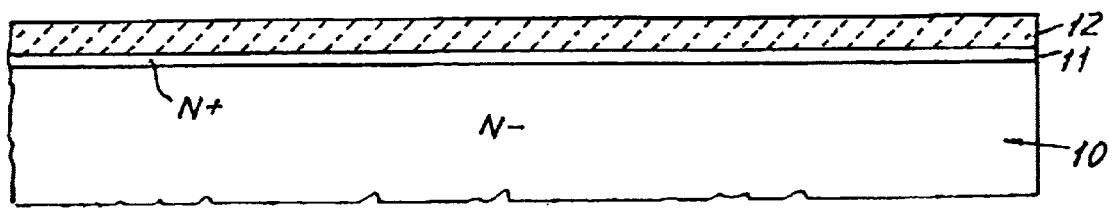
FIG. 1 shows a small portion of a wafer in which a plurality of die are simultaneously processed, after an optional N⁺ blanket diffusion and the growth of a field oxide.

Referring first to FIG. 1, there is shown a very small portion of the top of a silicon wafer 10. The wafer may be a wafer of any desired thickness with an N⁺ body (not shown) and an N-epitaxial layer which will receive the various junctions. While the description of the invention in FIGS. 1 to 6 describes an N type wafer body, the invention can also be carried out with a P type body.

The first step shown in FIG. 1 is the optional blanket implant of an N type species to form N⁺ region 11. This implant, which may be an arsenic implant of a dose 5E14/$cm^2$ can be eliminated from the process. Thereafter, a field oxide 12 is thermally grown atop wafer 10 to a thickness of about 7000 Å.

Figure 2:
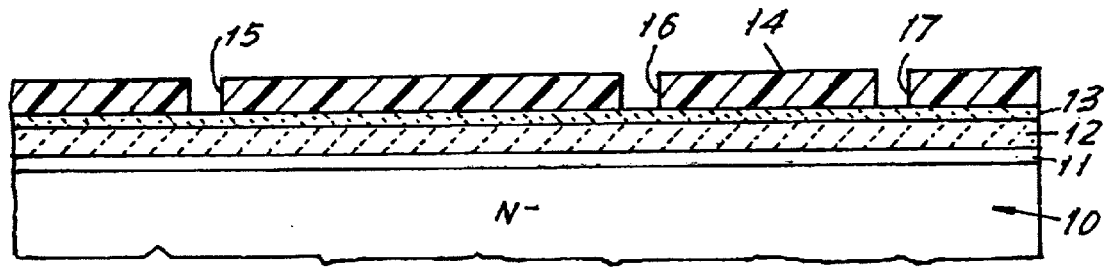
FIG. 2 shows the wafer of FIG. 1 after the deposition of an $Si_3N_4$ (nitride) layer atop the field oxide and the formation of a photoresist layer and the processing of the layer in the single mask step of the invention.

The next step is shown in FIG. 2 and is the deposition of a $Si_3N_4$ (nitride) layer 13 atop the oxide layer 12. Thereafter, a conventional photoresist layer 14 is deposited atop the nitride layer 13.

A single mask step is then carried out in which the photoresist 14 is patterned and a plurality of slots, including slots 15,16,17 are formed in the photoresist. Slots 15,16 and 17 are 3 of a large number of parallel slots, which may have a stripe or cellular topology, as desired. The slots shown are in a very small portion of wafer 10, with slot 15 defining a portion of the termination region of a single die or chip in the wafer, and slots 16 and 17 defining a small portion of the active region for that die.

Figure 3:
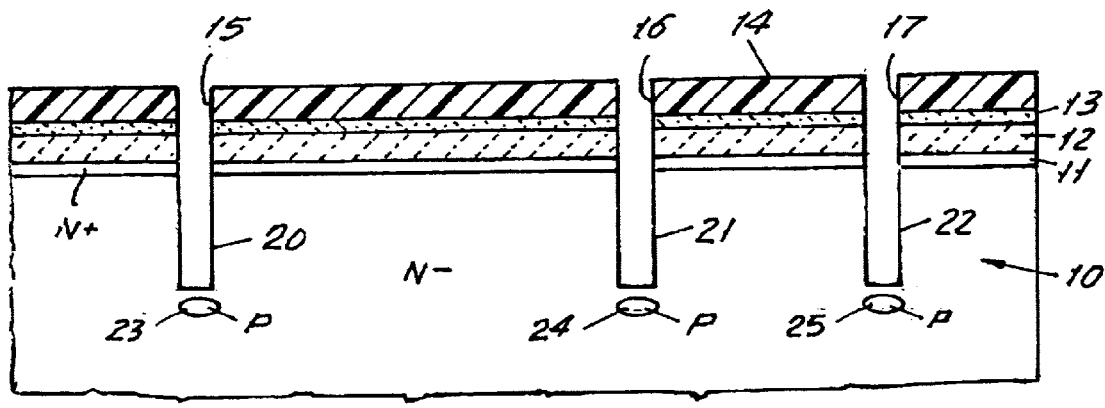
FIG. 3 shows the wafer of FIG. 2 after a nitride etch, a trench etch, and a P type species implant into the bottom of the trenches.

As next shown in FIG. 3, a conventional silicon nitride etch is carried out, etching the $Si_3N_4$ layer exposed by slots 15,16 and 17. Thereafter, a trench etch is carried out, etching the oxide layer 12 exposed by slots 15, 16 and 17, and thereafter etching narrow trenches 20,21 and 22. The trenches may have any desired depth, width and spacing which can be easily selected by those skilled in the art to produce the desired end device characteristics. However, trenches 21 and 22 and the other trenches in the active area are closer together than trench 21 and termination trench 20.

A boron implant (1E14/$cm^2$) is next carried out to implant boron regions 23,24 and 25 at the bottoms of trenches 20,21 and 22 respectively as shown in figure 3.

Figure 4:
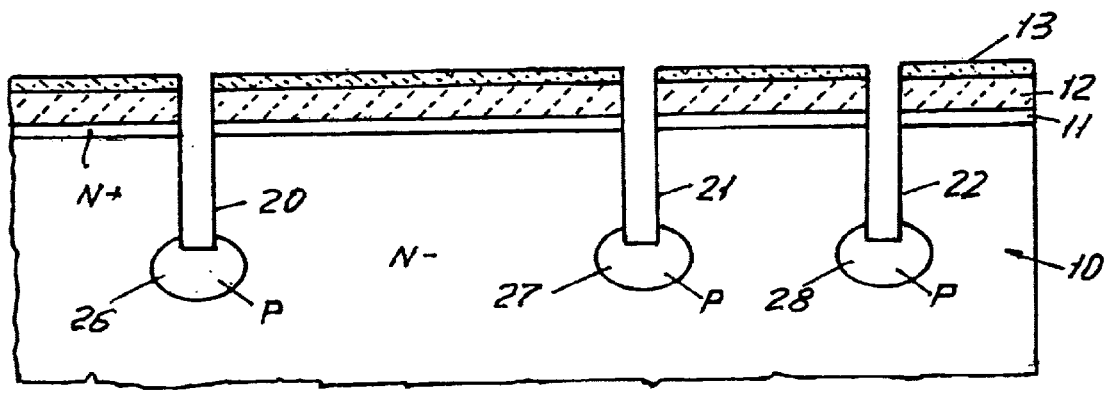
FIG. 4 shows the wafer of FIG. 3 after a resist strip and the P implant drive.

Thereafter, and as shown in FIG. 4, the resist 14 is stripped and the boron implants are driven at a suitable temperature, for a suitable time, to form P diffusions 26,27 and 28 which from P/N junctions to the N⁻ silicon 10.

Figure 5:
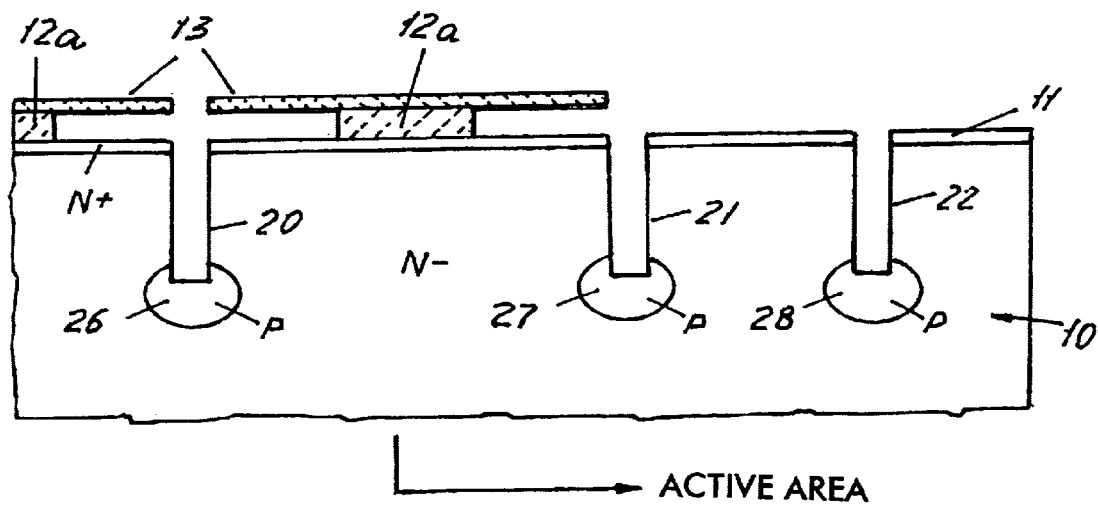
FIG. 5 shows the wafer of FIG. 4 after an oxide etch which completely clears the oxide in the active area, but only partially removes the oxide in the termination area.

As next shown in FIG. 5, a wet oxide etch is carried out etch the oxide 12 beneath the nitride layer 13. The spacing between the trenches 21 and 22 in the active area are sufficiently close that the wet etch completely etches all oxide 13 from under nitride 12. However, the trenches 21 and 20 are spaced sufficiently that the oxide etch is incomplete, learning oxide "islands" 12a in FIGS. 5 and 6. The nitride 13 over the active area in FIG. 5 is unsupported and lifts away, but the nitride 13 over the termination area remains supported by oxide islands 12a.

Figure 6:
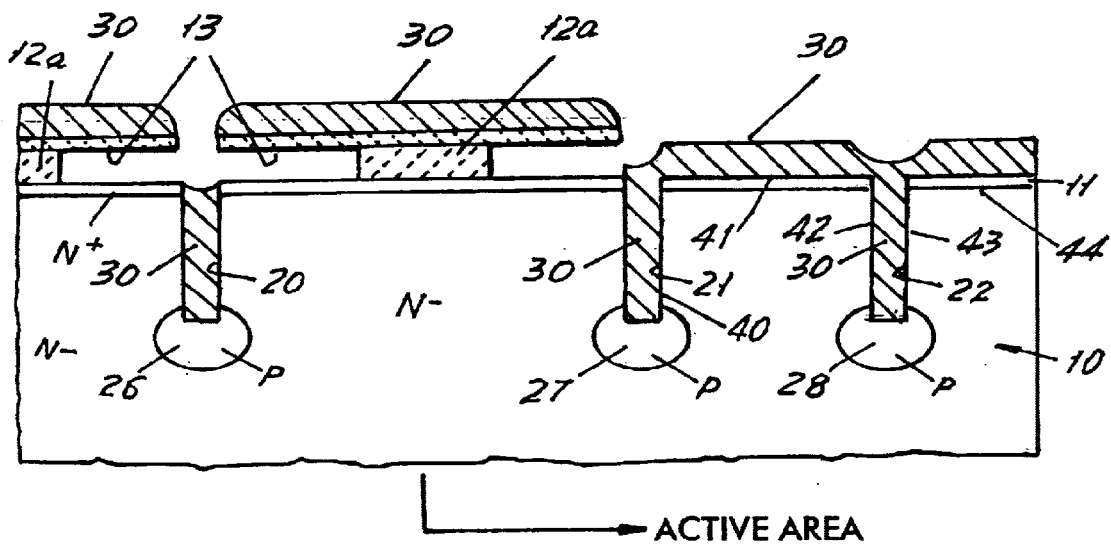
FIG. 6 shows the wafer of FIG. 5 after metal deposition.

Thereafter, and as shown in FIG. 6 a metal deposition (aluminum) is carried out, forming metal contact 30 over the active area and filling trenches 20,21 and 22. The contact of metal 30 to silicon surfaces 40 to 44 in FIG. 6 produces a very large area Schottky contact, while the metal in trenches 21 and 22 contact P regions 26,27 and 28.

Thereafter, the back surface of wafer 10 is ground back to a desired thickness, and a back metal is deposited on the back surface. A conventional forming gas anneal is then carried out to complete the process.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A process for the manufacture of a trench type diode comprising the steps of:
   a) forming a field oxide layer atop the surface of a silicon die portion of a wafer and forming a nitride layer atop the field oxide;
   b) opening a first plurality of spaced trenches in an active area of said die portion which have a first spacing from one another and simultaneously opening at least one trench in a termination region; said at least one trench being spaced from an adjacent one of said plurality of trenches by a spacing greater than said first spacing;
   c) etching the oxide beneath said nitride to completely remove the oxide in said active area and only partly removing the oxide in said termination area whereby the surface of the silicon in the active area is exposed; and depositing a Schottky-forming metal atop said active area and into all of said trenches.

2. The process of claim 1, which include s the step of implanting a blanket implant of a species having the conductivity type of said wafer into said surface before forming said field oxide.

3. The process of claim 1, wherein said metal contacts the walls of said slots and the mesa-top surfaces between said trenches to form a large area Schottky junction to said silicon.

4. The process of claim 3, which includes the step of implanting a blanket implant of a species having the conductivity type of said wafer into said surface before forming said field oxide.

5. The process of claim 1, which includes the step of implanting and diffusing a junction-forming impurity into the bottom of each of said trenches, thereby to form respective P/N junctions.

6. The process of claim 5, wherein said metal contacts the walls of said slots and the mesa-top surfaces between said trenches to form a large area Schottky contact to said silicon.

7. The process of claim 5, which includes the step of implanting a blanket implant of a species having the conductivity type of said wafer into said surface before forming said field oxide.

8. The process of claim 1, wherein the nitride layer remaining in said termination area after the partial removal of said oxide layer forms a shadow mask to permit metal deposition only into said trenches in said termination area.

9. The process of claim 8, wherein said metal contacts the walls of said slots and the mesa-top surfaces between said trenches to form a large area Schottky contact to said silicon.

10. The process of claim 8, which includes the step of implanting a blanket implant of a species having the conductivity type of said wafer into said surface before forming said field oxide.

11. The process of claim 8, which includes the step of implanting and diffusing a junction-forming impurity into the bottom of each of said trenches, thereby to form respective P/N junctions.

12. The process of claim 11, wherein said metal contacts the walls of said slots and the mesa-top surfaces between said trenches to form a large area Schottky contact to said silicon.

13. The process of claim 12, which includes the step of implanting a blanket implant of a species having the conductivity type of said wafer into said surface before forming said field oxide.

* * * * *